(12) United States Patent
Mizutani

(10) Patent No.: US 6,526,075 B2
(45) Date of Patent: Feb. 25, 2003

(54) METHOD FOR DRIVING A SEMICONDUCTOR LIGHT SOURCE DEVICE FOR TRANSMITTING A SIGNAL

(75) Inventor: Natsuhiko Mizutani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/105,049

(22) Filed: Jun. 26, 1998

(65) Prior Publication Data

US 2002/0181518 A1 Dec. 5, 2002

(30) Foreign Application Priority Data

Jul. 1, 1997 (JP) .............................. 9-190500
Jun. 16, 1998 (JP) ........................... 10-185639

(51) Int. Cl.$^7$ ............................................. H01S 3/10
(52) U.S. Cl. .............................. 372/27; 372/29; 372/32; 372/50
(58) Field of Search ........................ 372/27, 38, 29.02, 372/32, 50, 29.011, 29.015, 38.01, 38.02, 38.07

(56) References Cited

U.S. PATENT DOCUMENTS 5,659,560 A * 8/1997 Ouchi et al. ................... 372/27
5,742,418 A 4/1998 Mizutani et al. ............. 359/156

FOREIGN PATENT DOCUMENTS

JP 2-159781 6/1990

* cited by examiner

*Primary Examiner*—Paul Ip
*Assistant Examiner*—Armando Rodriguez
(74) *Attorney, Agent, or Firm*—Fitzpatrick, Cella, Harper & Scinto

(57) ABSTRACT

In a driving method or apparatus for driving a semiconductor laser as a light source for optical transmission, oscillation light of the semiconductor laser can be switched between two different polarization modes by modulating a current injected into a portion of a waveguide of the laser. The laser has characteristics that light in both modes is emitted within a polarization-mode switching range of the current and that intensities of the light in both modes respectively vary in accordance with an amount of the current within the polarization-mode switching range. The current injected into the portion of the waveguide is urged to a bias point current in the switching range, and a modulation signal current is superimposed on the bias point current such that the emitted light in at least one of the modes is intensity-modulated in accordance of an amount of the modulation signal current.

25 Claims, 14 Drawing Sheets

METHOD FOR DRIVING A SEMICONDUCTOR LIGHT SOURCE DEVICE FOR TRANSMITTING A SIGNAL

BACKGROUND OF THE INVENTION

1. Field of the Invention

The present invention relates to a driving method usable to modulate a light source device for optical transmission according to an analog or digital signal and achieve the transmission, such as high-density wavelength division multiplexing (WDM) optical communications, while suppressing dynamic wavelength variation during fast modulations. The present invention also relates to a semiconductor light source device using such a driving method, and optical communication method and system using such a driving method or a device.

2. Description of the Related Art

As an oscillation polarization-mode selective or switchable dynamic single mode semiconductor laser, the following device has been developed and proposed (see, for example, Japanese Patent Laid-Open No. 2-159781 (1990)). The oscillation polarization mode of the polarization switchable laser is changed by a digital signal which is produced by superimposing a minute-amplitude digital signal on a bias injection current. The device is a distributed feedback (DFB) laser in which a distributed reflector, formed of a grating, is introduced into a semiconductor laser resonator cavity, and its characteristic of wavelength selectivity is utilized therein. In the device, a strain is introduced into an active layer of a quantum well structure, or the Bragg wavelength is located at a position shorter than a peak wavelength of its gain spectrum, so that gains for the transverse electric (TE) mode and the transverse magnetic (TM) mode are approximately equal to each other for light at wavelengths close to an oscillation wavelength, under a current injection condition near its oscillation threshold state. Further, a plurality of electrodes are arranged and currents can be unevenly injected through those electrodes. An equivalent refractive index in the cavity is nonuniformly distributed by such uneven current injection, and the laser oscillates in either the TE mode or the TM mode and at a wavelength which satisfies a phase matching condition and shows a minimum threshold gain. When the balance of the uneven current injection is slightly changed to vary a competitive relation of the phase condition between the TE mode and the TM mode, the polarization mode and the wavelength of the laser can be switched.

As a driving method of that device, a TE/TM switching method has been proposed in which the above minute-amplitude digital signal is superimposed on a bias current injected through one electrode of a two-electrode DFB semiconductor laser. This is the technique according to which bias points of currents injected through the two electrodes are appropriately set, the polarization-modulated output light from the laser is transmitted through a polarizer to be converted to intensity-modulated light, and TE-mode polarized light can be thus obtained with a large extinction ratio.

In the above-discussed digital polarization modulation system, however, when transmission of an analog signal, such as a video signal, is to be performed, the analog signal needs to be converted to a digital signal by an analog-to-digital converter and the signal is sent thereafter. Hence the number of components of the system increases in the analog video transmission. Further, the system could not cope with the expansion of a transmission capacity aimed by a multi-value digital transmission system.

SUMMARY OF THE INVENTION

An object of the present invention is to provide a driving method or apparatus for driving a polarization switchable laser to generate an intensity-modulated signal (typically, an intensity-modulated analog signal or a multi-value intensity-modulated digital signal), and a light source apparatus for performing optical transmission using such a driving method. Another object of the present invention is to provide an optical communication system or method for performing transmission of an intensity-modulated signal using such a light source apparatus, and a multiplexing optical communication system or method for performing transmission of multiplexed intensity-modulated signals using such a light source apparatus.

The present invention is directed to a driving method or apparatus for driving a semiconductor laser as a light source for optical transmission, wherein a semiconductor laser is used, which is provided with a structure in which oscillation light of the laser can be switched between two different polarization modes by modulating a current injected into a portion of a waveguide of the laser. The laser has characteristics that light in both the two modes is emitted within a polarization-mode switching range of the current and that intensities of the light in both the two different polarization modes respectively vary in accordance with an amount of the current within the polarization-mode switching range. The current injected into the portion of the waveguide is urged to a bias point current in the switching range, and a modulation signal current is superimposed on the bias point current such that the emitted light in at least one of the two modes is intensity-modulated in accordance with an amount of the modulation signal current. The above modulation signal current is an analog-signal modulation current, an analog-signal modulation current generated from a digital signal by a-modulation unit, a multi-value digital-signal modulation current generated from a digital signal by a modulation unit, or the like.

The principle of a driving method or apparatus of the present invention will be described referring to FIG. 1 showing an example of a curve of I (a current injected into the portion of the waveguide) vs. L (light output) for TE-mode light and TM-mode light from the laser during DC driving. The curve shows outputs of the TE-mode light and TM-mode light appearing when a constant current is injected into an electrode on, a light emission side of the laser and a current injected into another electrode on a modulation side of the laser is changed. Here, the semiconductor laser has characteristics that light in both polarization modes is emitted within the switching range of the current and that intensities of the light in both polarization modes vary substantially linearly in accordance with an amount of the current within the switching range. Where the polarization switchable laser is a single mode laser, such as a DFB laser, both of the TE-mode light and TM-mode light oscillate in a single longitudinal mode at Bragg wavelengths (differing between the TE mode and the TM-mode) determined from the grating of the DFB laser or the like.

There exists a bias state in which the TE-mode light and TM-mode light coexist; near a switching point in the I-L curve (or in the switching range). The width of the current in the bias state (i.e., the width of the switching range) is indicated by $\Delta I_{sw}$. When a modulation signal (here, an analog modulation signal is shown) is applied with an amplitude smaller than $\Delta I_{sw}$, the TE-mode light is intensity-modulated with a large amplitude due to the characteristic that the I-L curve steeply rises in the switching range. Where a sign-inverted modulation signal is applied, desirably-modulated TM-mode light can be obtained.

In the above discussion, the example is selected which has the switching range wherein TM-mode light is switched over to TE-mode light as the bias current injected into the portion of the waveguide increases. However, when the I-L curve is selected which has the switching range wherein TE-mode light is switched over to TM-mode light as the bias current increases, intensity-modulated light in the TM-mode can be naturally obtained. In this case, the relation between TE-mode light and TM-mode light in FIG. 1 is reversed by adjusting bias currents injected into respective waveguides.

More specifically, the following configurations can be adopted.

The semiconductor laser may be comprised of a distributed feedback semiconductor laser wherein a waveguide and a diffraction grating formed near the waveguide are arranged, the waveguide includes an active layer, the active layer is formed of a multiple quantum well structure into which a tensile strain is introduced, and a heavy-hole ground level in a quantum well of the multiple quantum well structure is nearly equal to a light-hole ground level in the quantum well of the multiple quantum well structure, or the light-hole ground level is closer to an electron ground level than the heavy-hole ground level is. Thus, gains for the TE mode and the TM mode can be made nearly equal in the DFB laser, and the above switching can be achieved by such a polarization switchable laser.

Further, the semiconductor laser may be comprised of a structure in which there are arranged at least two electrodes in a cavity direction of the laser, there are arranged a plurality of waveguide portions, which constitute the cavity, corresponding to those electrodes such that currents can be independently injected into those waveguide portions, the respective waveguide portions include active layers with a plurality of quantum wells which respectively include at least one non-strained or compressively-strained quantum well and at least one tensile-strained quantum well, band gaps between ground levels in those quantum wells are set nearly equal to each other, and combinations of the quantum wells in those waveguide portions are different from each other. Currents can be independently injected into the thus-constructed waveguide portions, and their injection current dependencies are different from each other, so that round-trip gains for the TE mode and the TM mode can be made close to each other. As a result, the bias state of injection currents, in which oscillation modes compete with each other, can be established. The above modulation can be performed by the above driving method in the laser urged to such a bias state. Since the active layer in each waveguide portion includes at least one well for contributing to the TE-mode gain and at least one well for contributing to the TM-mode gain, each active layer has gains for both polarization modes. Further, combinations of those wells are different between those waveguide portions, so that injection current dependencies of gain spectra of those active layers differ from each other. Since each waveguide portion has gains for both modes, fluctuation of the light intensity distribution in the cavity is small during polarization switching. Thus, switching characteristic that wavelength fluctuation due to the hole burning effect is small can be obtained.

The semiconductor laser with suppressed hole burning effect may be comprised of a distributed feedback semiconductor laser wherein a waveguide with an active layer and a diffraction grating formed near the waveguide are arranged. The polarization switching is effected between the TE mode and the TM mode at Bragg wavelengths of the diffraction grating (i.e., between single longitudinal modes), and the switching can be stably achieved by a minute current.

In the driving method or apparatus of the semiconductor laser, an amount of combined current of the modulation signal current and the bias point current is preferably regulated well within the switching range in which light in both polarization modes is emitted. Hence, the intensity modulation with little non-linearity and preferable linearity (i.e, small or little distortion from the original signal) can be achieved.

The driving apparatus may further include a unit for separating the intensity-modulated light in the two different polarization modes emitted by the semiconductor laser from each other, a unit for coupling the separated light in one of the two different polarization modes to a light transmission line, a unit for converting the separated light in the other of the two different polarization modes to an electric signal, and a unit for controlling the current injected into the semiconductor laser based on the electric signal such that a modulation condition of the light coupled to the light transmission line can be stabilized. Hence, the current bias state can be monitored by using the light in the other mode not used for transmission, and the bias point can be stabilized to assure preferable linearity of the signal.

The controlling unit may includes a low pass filter for transmitting the electric signal therethrough, a differential amplifier for comparing a signal output from the low pass filter with a reference voltage to supply its resultant output, and a proportional-plus-integral circuit for feeding back the resultant output to a DC current source for driving the semiconductor laser at an appropriate feedback rate. The bias point can be stably controlled by a simple structure.

A light source apparatus for optical transmission for achieving the object of the present invention includes the above driving apparatus for driving the semiconductor laser as a light source for optical transmission using the above driving method, and a polarization-mode selecting unit for selecting light in one of the two different polarization modes from light emitted from the semiconductor laser.

These advantages and others will be more readily understood in connection with the following detailed description of the preferred embodiments in conjunction with the drawings.

DESCRIPTION OF THE PREFERRED EMBODIMENTS

Embodiments of a driving method usable when a light source device for optical communications is modulated in an analog manner, analog-like manner, or digital manner and optical communication method and system using the driving method and constructed in accordance with the present invention will be described with reference to the drawings.

First Embodiment

Figure 2:
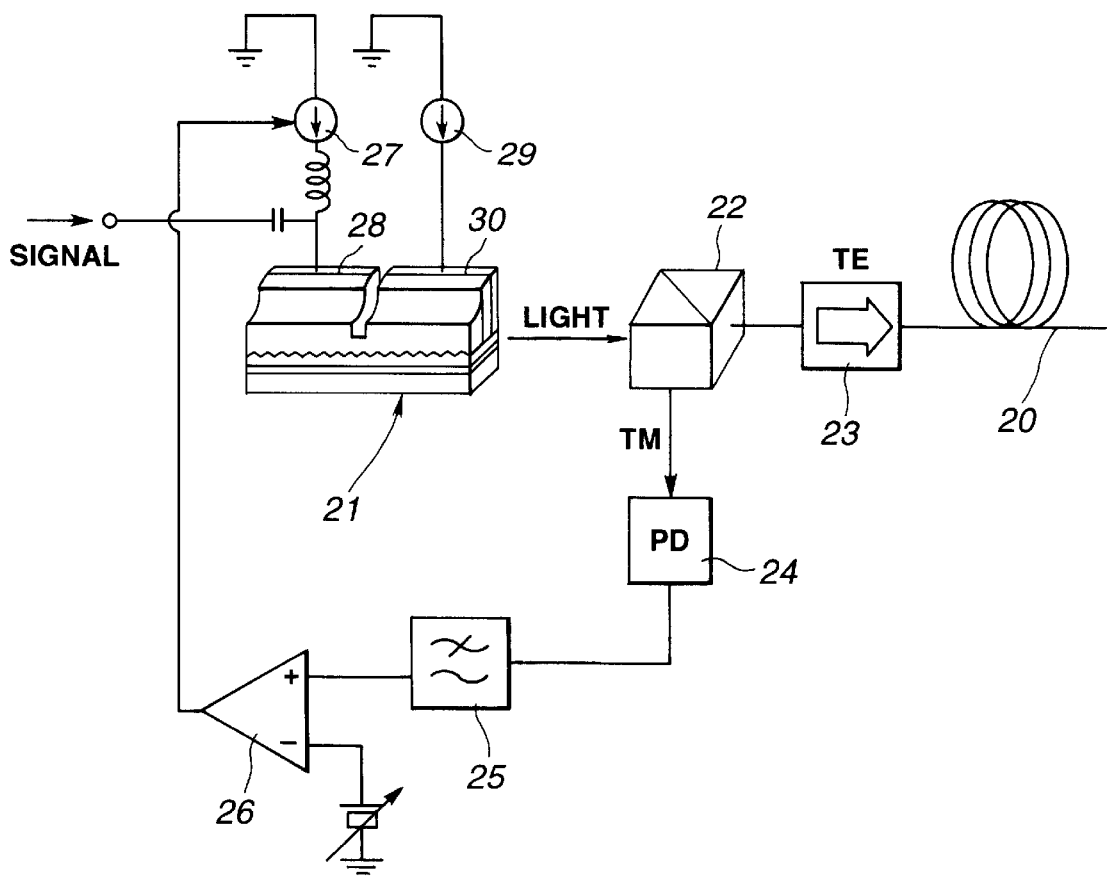
FIG. 2 is a view illustrating a method for driving a polarization switchable semiconductor laser of a first embodiment according to the present invention.
Figure 3:
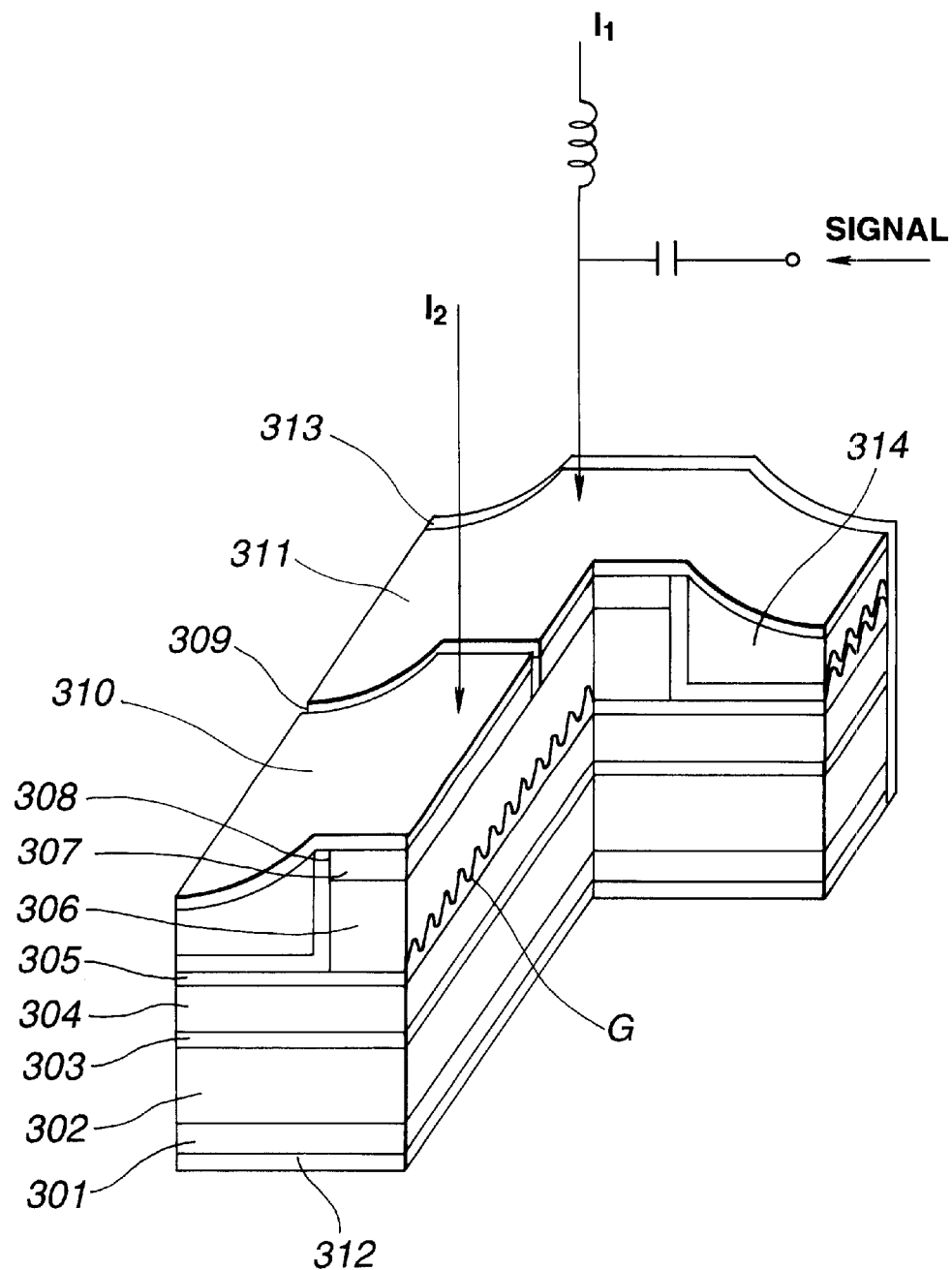
FIG. 3 is a partial cut-away perspective view illustrating a polarization switchable semiconductor laser used in the first embodiment.

A first embodiment will be described with reference to FIGS. 1 to 6. As illustrated in FIG. 3 showing the overall structure of a DFB semiconductor laser, an n-InP buffer layer 302, a lower light guide layer 303 of InGaAsP having a thickness of 0.1 μm and a band gap wavelength of 1.17 μm, a strained three-well quantum well active layer 304 comprised of well layers of InGaAs with a thickness of 13 nm and a tensile strain of 0.6% and barrier layers of InGaAsP with a thickness of 10 nm and a band gap wavelength of 1.17 μm, and an upper light guide layer 305 of InGaAsP having a thickness of 0.15 μm and a band gap wavelength of 1.17 μm are formed on an n-InP substrate 301. A grating G with a depth of 0.05 μm is formed on the upper light guide layer 305. Further, a p-InP clad layer 306, a p-InGaAs contact layer 307, and an insulating layer 308 of SiN$_x$ are laid down over the the upper light guide layer 305 with the grating G.

Further, in FIG. 3, reference numeral 309 designates an electrode-separation region formed by removing the contact layer 307. Reference numeral 310 designates a p-side electrode of Cr/Au formed on a light emission side of the laser. Reference numeral 311 designates a p-side electrode of Cr/Au formed on a side of the laser into which a current of a signal superimposed on a bias current is to be injected. Reference numeral 312 designates an n-side common electrode of AuGe/Au. Reference numeral 313 designates an antireflection layer of an SiO layer. Reference numeral 314 designates a polyimide with which surroundings of a ridge are buried. The ridge is formed with a width of 2.5 μm by selectively removing the contact layer 307 and the p-InP layer 306.

A heavy-hole energy level in the well with the tensile strain of 0.6% and the thickness of 13 nm of the active layer 304 is set about equal to a light-hole energy level thereof, so that a gain for light in the TM Lode is made close to that for light in the TE mode. Thus the structure of the active layer 304 contributes to achieve a preferable polarization switching.

Figure 1:
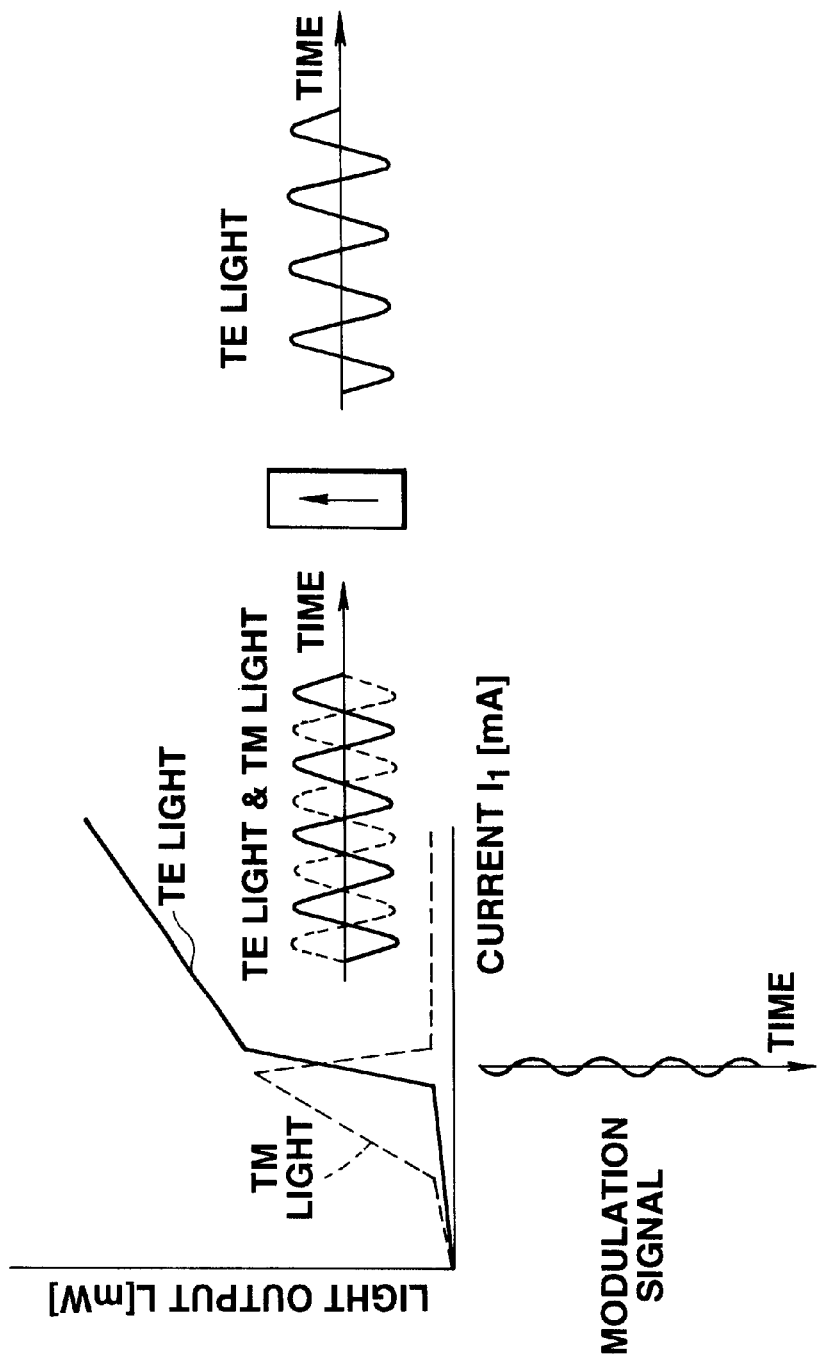
FIG. 1 is a view illustrating an intensity modulation method using a polarization switchable laser according to the present invention.

The polarization switching characteristic as illustrated in FIG. 1 can be attained by a device wherein the pitch of the grating G is set in a range between 240.2 nm and 241.8 nm in the above structure, i.e., the Bragg wavelength for the TE mode is approximately set in a range of ASE (Amplified Spontaneous Emission) peak wavelength plus and minus (±) 10 nm. More specifically, oscillation in the TM mode is started, as illustrated by a dotted line in FIG. 1, upon injection of a current above a threshold current which can be reached by increasing a current $I_1$ injected through the electrode 311 while a constant bias current $I_2$ being injected through the electrode 310. When the injection current $I_1$ further increases, oscillation in the TE mode begins as illustrated by a solid line in FIG. 1. At the same time, oscillation in the TM mode attenuates and substantially stops eventually. A single longitudinal mode oscillation at the Bragg wavelength is effected for each of the TE mode and the TM mode since the distributed feedback reflector of the grating G is built in the device. Wavelengths for the respective modes differ from each other due to birefringence of the waveguide in the device. The wavelength of TE-mode light is about 3.5 nm longer than that of TM-mode light. The injection current $I_1$ needs to be increased by 4 mA to thoroughly switch the polarization mode. Light in both polarization modes is simultaneously output during the switching operation. The intensity of light in at least one of the TE mode and the TM mode must be changed substantially linearly in the switching range. Both modes vary approximately linearly in this embodiment as illustrated in FIG. 1. The polarization mode selected as intensity-modulated analog light should be a mode that changes approximately linearly in the switching range to preferably achieve the object of the present invention.

Figure 4A:
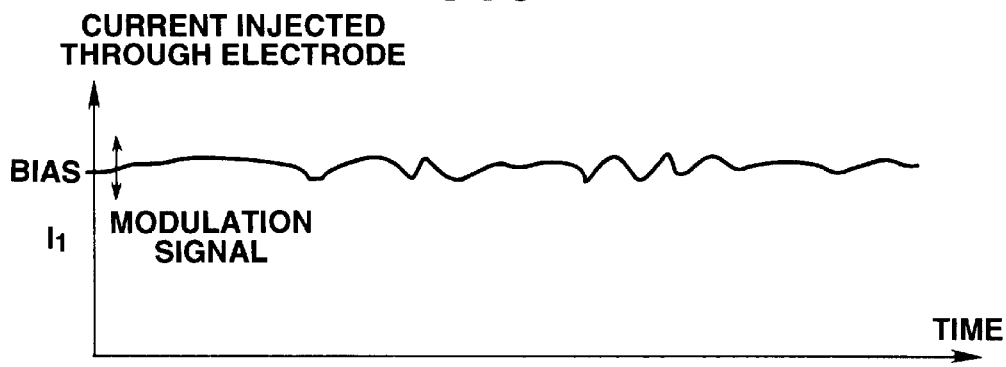
FIGS. 4A–4C are graphs illustrating a modulation current and light outputs in TE mode and TM mode changing over time.
Figure 4B:
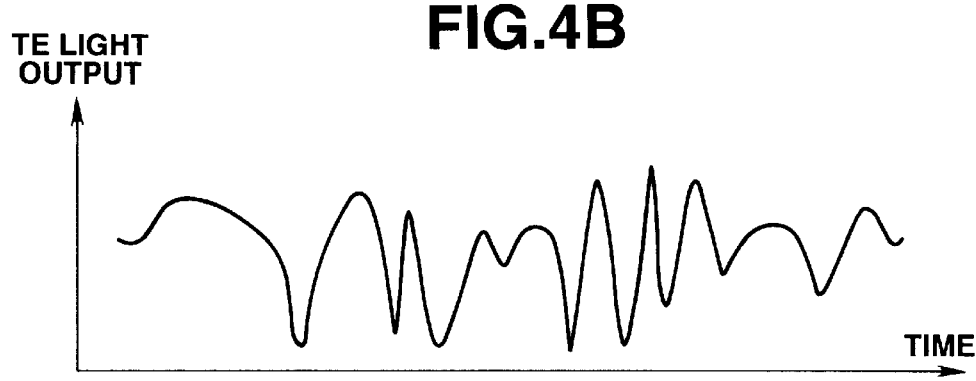
Figure 4C:
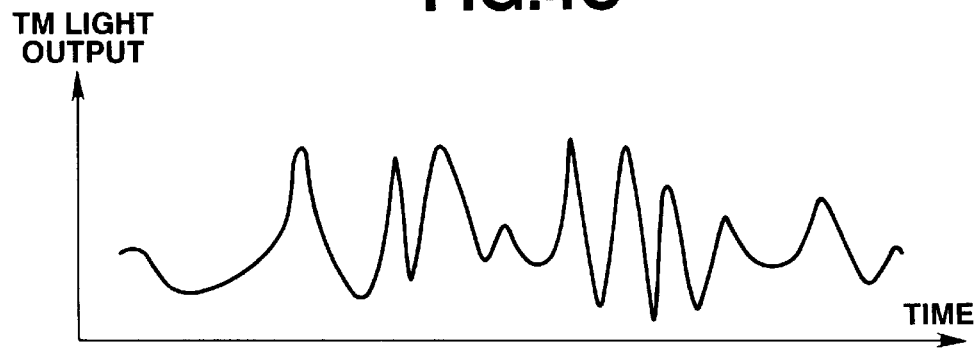

In this embodiment, the bias point of the current $I_1$ injected through the electrode 311 is placed within the both-mode coexisting range or switching range, and a minute analog signal is then applied to modulate the light intensity of each mode accordingly. Light in one (TE-mode light in the case of FIG. 1) of the two polarization modes is selected, for example, by a polarizer placed in front of the emission end of the laser to obtain the intensity-modulated analog light modulated according to a modulation signal. The analog light modulated according to the modulation signal can thus be obtained since light in each polarization mode changes approximately linearly in the switching range. FIGS. 4A, 4B, and 4C show examples of shapes changing over time.

FIG. 4A depicts the shape of the current (the combination of the modulation current and the DC bias) injected through the electrode 311; FIG. 4B depicts the intensity of light in the TE mode transmitted through a beam splitter, for example; and FIG. 4C depicts the intensity of light in the TM mode separated by the beam splitter. As can be seen from FIGS. 4A, 4B, and 4C, the intensity-modulated signal modulated according to the modulation signal can be obtained by the intensity of light in the TE mode, and phases of modulated intensities of the TE-mode light and the TM-mode light are in an anti-phase relation. The modulation band range is from 200 kHz to 2 GHz, since the characteristic of the laser is reduced in a low-frequency range under the influence of heat.

As described above, the analog signal with an amplitude less than the width of the switching range is applied to obtain the intensity-modulated analog signal in the present invention. In contrast thereto, the digital signal with an amplitude well over the switching width is applied to the electrode 311 to effect mode switching between the TE mode and the TM mode and transmit the digital signal in the above-discussed conventional polarization modulation.

A specific driving method of this embodiment for performing the above modulation will be described with reference to FIG. 2. Light in the TE mode from a laser 21 separated by a polarization beam splitter (PBS) 22 is coupled to an optical fiber 20 through an isolator 23 to be transmitted as a signal. The PBS 22 acts as the polarizer in FIG. 1. The isolator 23 not only prevents light reflected by the transmission line and the like from being incident on the laser 21 and confusing the oscillation thereof, but also improves an extinction ratio between light in the TE mode and the TM mode using Gland-Thompson prisms provided at opposite ends of the isolator 23. This example can attain the extinction ratio of more than 20 dB.

Figure 5:
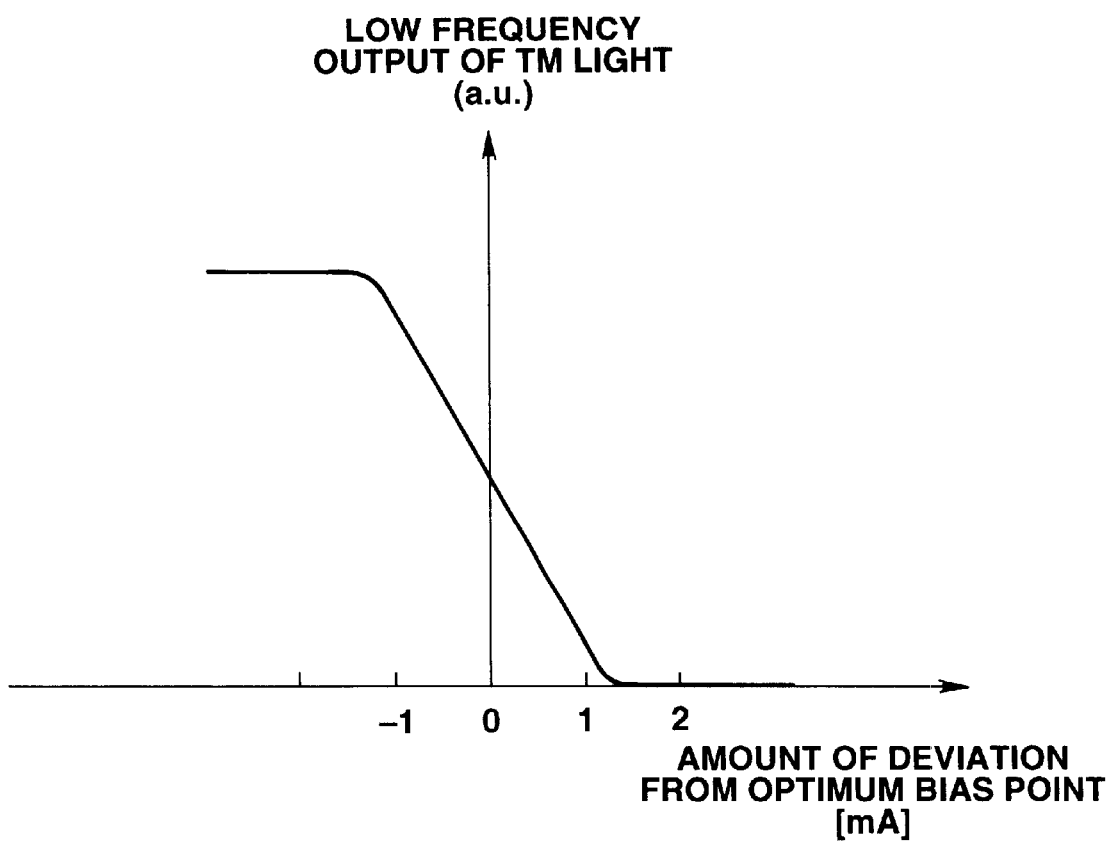
FIG. 5 is a graph illustrating a relation between an amount of deviation from an optimum bias point and a monitoring output.

On the other hand, a photodiode 24 detects light in the TM mode out of oscillation light from the laser 21, which is selected by PBS 22, to monitor the bias point of the current. A low pass filter (LPF) 25 produces a signal in a band below 10 kHz from the detected signal. Thus, components modulated by high speed signals are averaged, and an output voltage varying according to the deviation amount from an optimum point of the bias point can be obtained as illustrated in FIG. 5. A differential amplifier 26 compares the output voltage with a reference voltage and feeds its result back to a power source 27 for supplying a DC bias to an electrode 28 (corresponding to the electrode 311 in FIG. 3) provided on the modulation-signal supply side of the laser 21. Stabilization of the bias point toward the optimum point is performed by PI (proportion plus integral) control, for example. Long-term variation of the bias point due to variations of temperature and the like can thus be dissolved.

The feedback of the above control may be performed to a current source 29 for supplying a DC bias to an electrode 30 (corresponding to the electrode 310 in FIG. 3) provided on the non-modulation-signal supply side of the laser 21.

As described above, the laser can emit intensity-modulated analog light in each polarization mode when the analog modulation signal is applied while the current injected into a portion of the waveguide of the laser is stably confined within the switching range.

Second Embodiment

Figure 6:
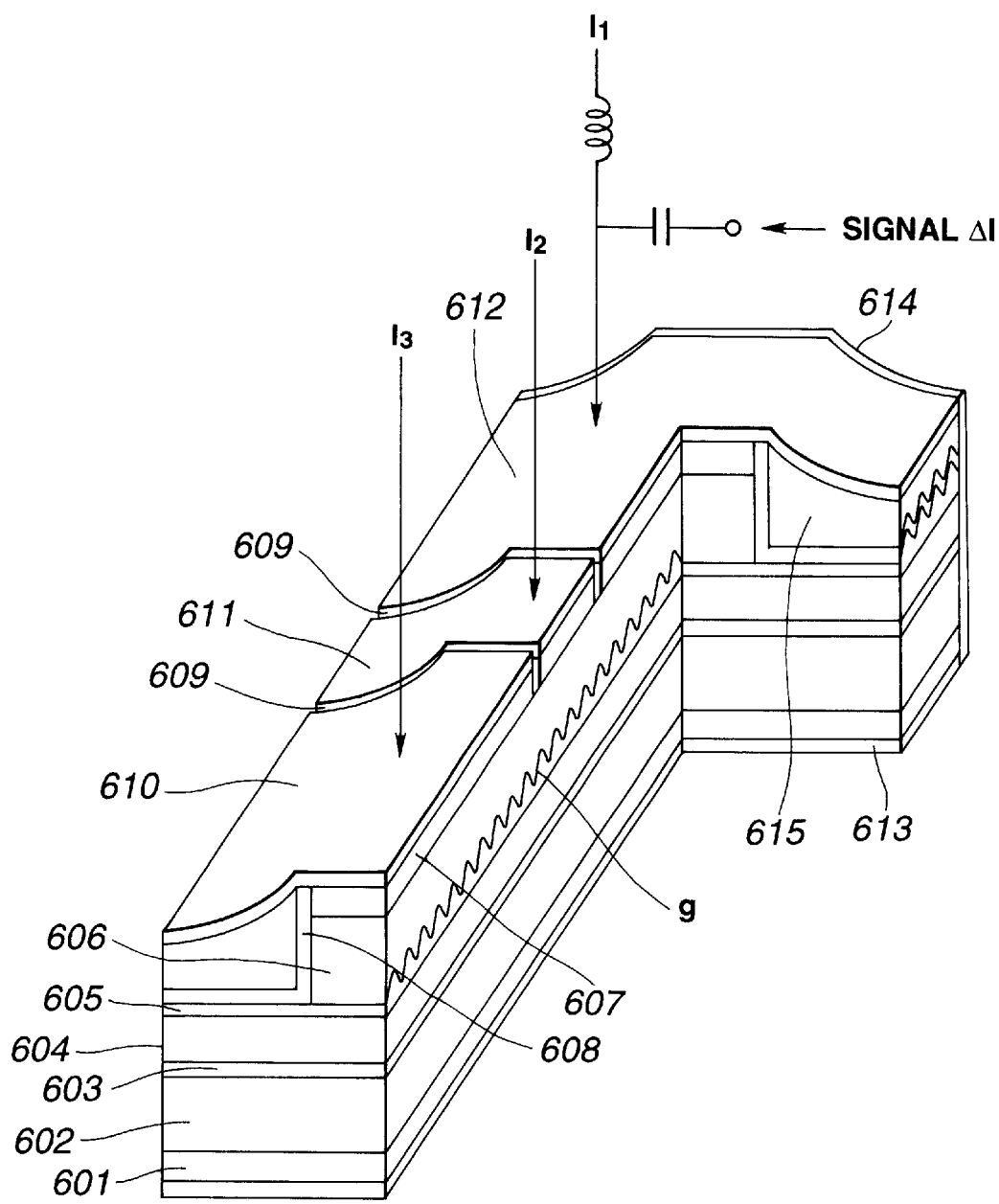
FIG. 6 is a partial cut-away perspective view illustrating a polarization switchable semiconductor laser used in a second embodiment.

A second embodiment will be described with reference to FIG. 6. FIG. 6 schematically illustrates a polarization switchable DFB semiconductor laser in a cut-away form. The structure of the laser is basically the same as that used in the first embodiment, except that the laser of the second embodiment has a three-electrode structure for improving controllability or flexibility of the bias point of the polarization switching and the switching current width.

As illustrated in FIG. 6, an n-InP buffer layer 602, a lower light guide layer 603 of InGaAsP, a strained three-well quantum well active layer 604 comprised of well layers of InGaAs with a thickness of 13 nm and a tensile strain of 0.6% and barrier layers of InGaAsP with a thickness of 10 nm, and an upper light guide layer 605 of InGaAsP are formed on an n-InP substrate 601 in this order. A grating g with a depth of 0.05 $\mu$m is formed on the upper light guide layer 605. Further, a p-InP clad layer 606, a p-InGaAs contact layer 607, and an insulating layer 608 of $SiN_x$ are laid down over the upper light guide layer 605 with the grating g.

Further, in FIG. 6, reference numeral 609 designates an electrode-separation region formed by removing the contact layer 607. Reference numeral 610 designates a p-side electrode of Cr/Au formed on a light emission side. Reference numeral 611 designates a p-side electrode of Cr/Au formed in a phase control region. Reference numeral 612 designates a p-side electrode of Cr/Au formed on a side into which a current of a signal superimposed on a bias current is injected. Reference numeral 613 designates an n-side common electrode of AuGe/Au. Reference numeral 614 designates an antireflection layer of an SiO layer. Reference numeral 615 designates a polyimide with which surroundings of a ridge are buried. The ridge is formed with a width of 2.5 $\mu$m by selectively removing the contact layer 607 and the p-InP layer 606.

Constant DC bias currents $I_3$ and $I_2$ are respectively injected through the electrodes 610 and 611 on the emission side and in the phase control region of the above laser. Under such a condition, the bias point is controlled to an appropriate point of the polarization switching by adjusting a current injected through the electrode 612. Even when the oscillation wavelength needs to be accurately controlled for use in the wavelength division multiplexing system, the biases of the two, electrodes 610 and 611 and the switching range can be adjusted to set the oscillation wavelength accurately. A DC bias $I_1$ and a modulation current $\Delta I$ are injected through the electrode 612 under the thus-adjusted condition.

The same feedback control as that of the first embodiment is performed to stabilize the bias point. To which DC bias current the feedback control is to be performed, may be decided according to the case.

Third Embodiment

Figure 7:
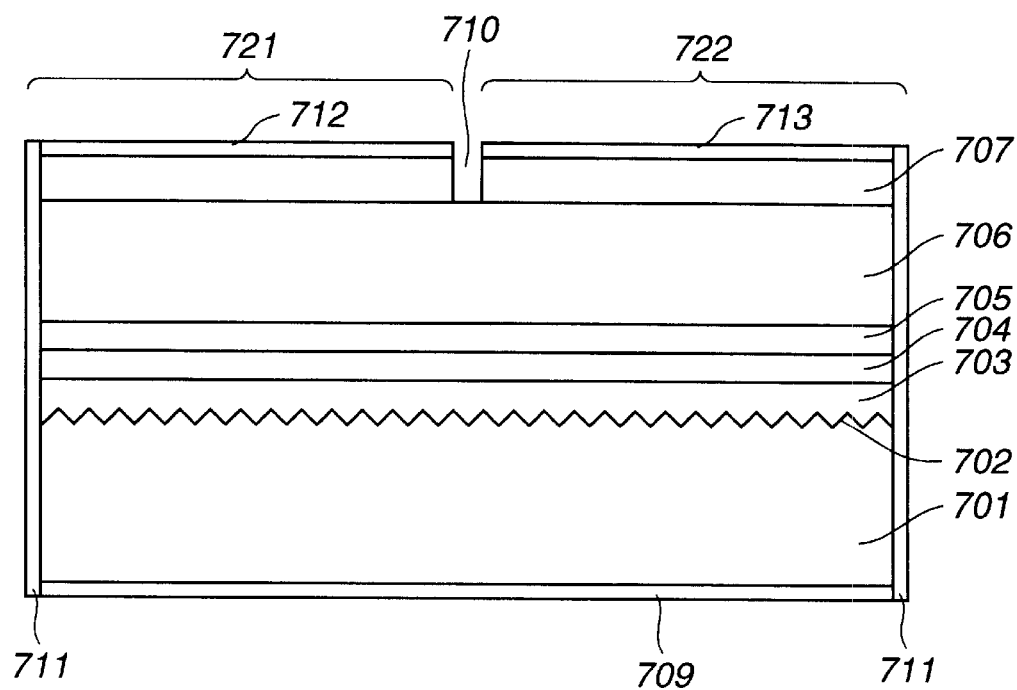
FIG. 7 is a cross-sectional view illustrating a polarization switchable semiconductor laser used in a third embodiment.

A third embodiment of the present invention will be described with reference to FIG. 7 which is a cross-sectional view of a semiconductor laser. In FIG. 7, reference numerals 721 and 722 respectively designate two waveguide portions into which currents can be injected independently of each other. Layer structures of the waveguide portions 721 and 722 are common to each other, except active layers therein. As illustrated in FIG. 7, on an n-type InP substrate 701, a diffraction grating 702 with a depth of 0.05 $\mu$m and a pitch of 0.24 $\mu$m is formed and the grating 702 is buried with an n-type InGaAsP layer 703 having a thickness of about 0.2 $\mu$m and a band gap wavelength of 1.15 $\mu$m to obtain a flat face. Then, an undoped multiple quantum well (MQW) active layer 704 is formed on the InGaAsP layer 703. Details of the active layer 704 will be described later.

Further, a p-type InGaAsP upper light guide layer 705 having a thickness of 0.15 $\mu$m and a band gap wavelength of 1.15 $\mu$m, a p-type InP clad layer 706 having a thickness of 1.5 μm and a p-type InGaAs contact layer 707 having a thickness of 0.3 μm are consecutively grown on the MQW active layer 704.

To fabricate a structure for laterally confining light and carriers, a ridge is formed and a lateral width of the active layer 704 is etched to 2 μm. The ridge is laterally surrounded by high-resistance InP layers (not shown). Further, p-side electrodes 712 and 713 of Cr/AuZnNi/Au and an n-side electrode 709 of an AuGeNi/Au layer are respectively formed on the contact layer 707 and the bottom surface of the substrate 701. Those electode layers 712, 713 and 709 are alloyed. Finally, the p-side electrode and the contact layer 707 are removed at an electrode separation region 710 for forming the two electrically-separated p-side electrode 712 and 713, and antireflection layers 711 of $SiO_2$ are deposited on opposite facets of the device.

Figure 8A:
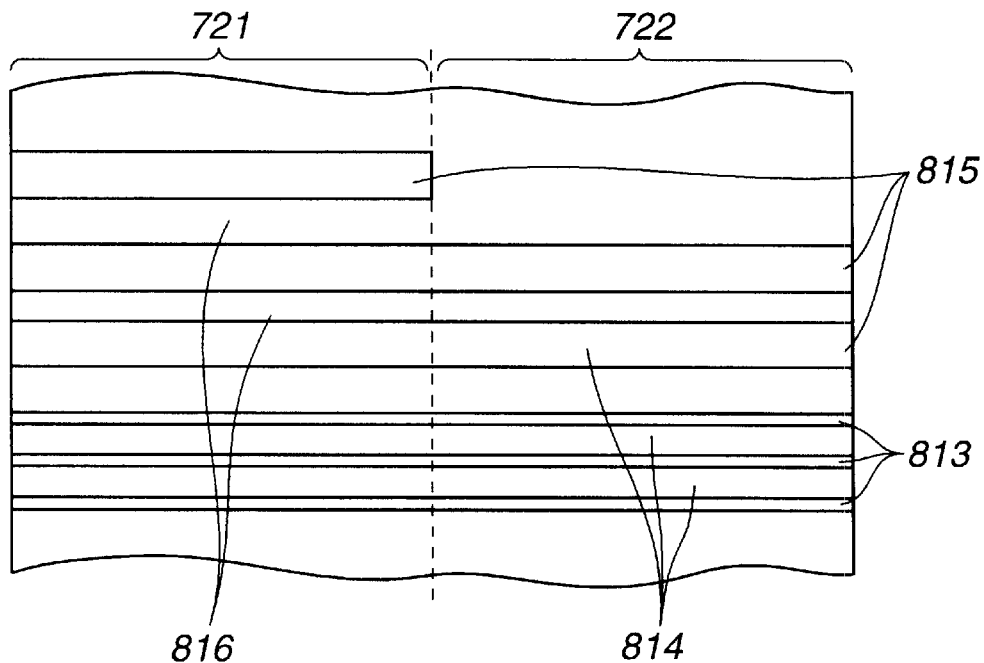
FIG. 8A is a cross-sectional view illustrating the structure of a multiple quantum well active layer in the semiconductor laser used in the third embodiment.
Figure 8B:
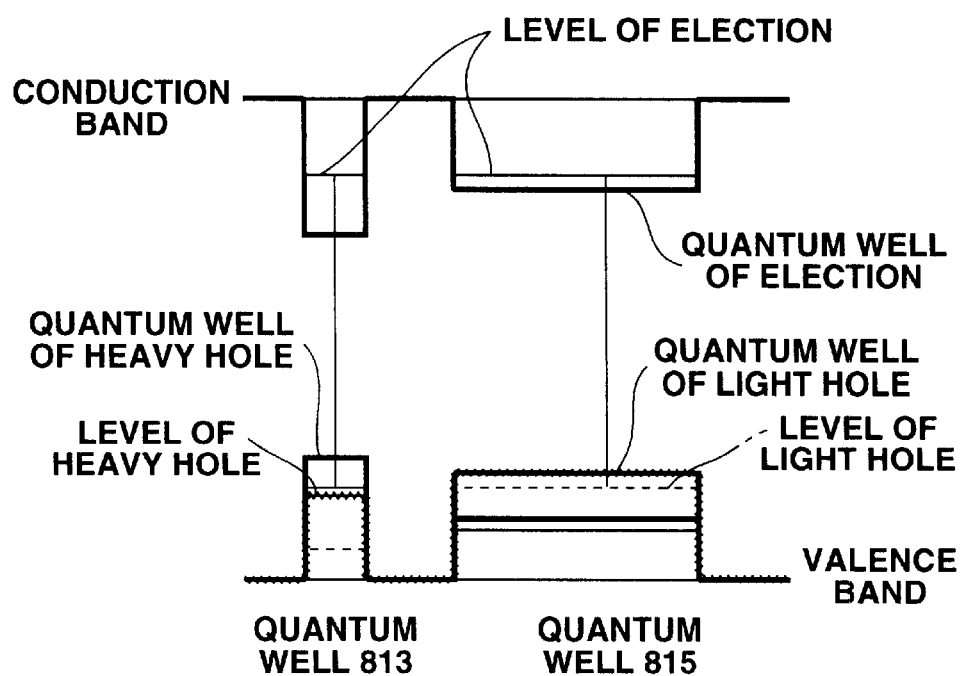
FIG. 8B is a view illustrating a band gap structure of the multiple quantum well active layer in the semiconductor laser used in the third embodiment.

The structure of the MQW active layer 704 will be described with reference to FIG. 8A. The MQW active layer 704 consists of the combination of a compressively-strained quantum well structure and a tensile-strained quantum well structure. The compressively-strained quantum well structure is comprised of InGaAs well layers 813 (thickness: 4 nm, and 0.5% compressive strain) and InGaAsP barrier layers 814 (thickness: 15 nm, and band gap wavelength: 1.15 μm). The tensile-strained quantum well structure is comprised of InGaAs well layers 815 (thickness: 18 nm, and 0.9% tensile strain) and InGaAsP barrier layers 816 (thickness: 15 nm, and band gap wavelength: 1.15 μm). FIG. 8B illustrates their band gap structures. The band gap wavelength of each quantum well structure is approximately 1.55 μm. The compressively-strained well 813 chiefly imparts a gain to light at a wavelength near the device's Bragg wavelength for the TE mode, which is associated with a transition between a ground level of electrons in the conduction band and a ground level of heavy holes in the valence band, whereas the tensile-strained well 815 imparts a gain to light at wavelengths near the device's Bragg wavelengths for the TE mode and the TM mode, which is associated with a transition between the ground level of electrons in the conduction band and a ground level of light holes in the valence band.

The first waveguide portion 721 includes three lower compressively-strained well layers 813 and three upper tensile-strained well layers 815. In contrast, the second waveguide portion 722 contains three lower compressively-strained well layers 813 and two upper tensile-strained well layers 815. In such a layer structure, light in the TM mode would be continuously emitted if a DFB-LD contained only the first waveguide portion 721, while light in the TE mode would be continuously emitted if a DFB-LD contained only the second waveguide portion 722. In the above-discussed device of this embodiment, the layer structures of the first and second waveguide portions 721 and 722 are combined with the grating having the above-described pitch. In the assumed DFB-LD having only one of the first and second waveguide portions 721 and 722, a relatively large optical gain would also be imparted to light at a wavelength near the Bragg wavelength of the mode that would not reach an oscillation state. Therefore, such a condition is also established in the structure of this embodiment, and adverse influence due to the hole burning effect is reduced.

Such a device with the mutually-connected first and second waveguide regions 721 and 722 has the following characteristics, and its operation is not simple to describe. One reason therefor is that polarization dependencies of gain spectra of the first and second regions 721 and 722 are different from each other. Another reason is that the wavelength dependency (or the polarization dependency) of the round-trip loss exists in the DFB laser.

In such a structure of this embodiment, however, adjustment of amounts of currents injected into the two waveguide portions considering the above characteristics can establish a bias state in which the round-trip gains for the TE mode and the TM mode compete with each other. In the competitive state, when the current injected through one of the electrodes is increased, light, for example, in the TM mode oscillates. This state can be set as a modulation bias point. At such a modulation bias point, when a current, which is created by superposing a minute modulation signal on the bias current, is injected through another electrode, the oscillation polarization mode can be switched between the TM mode and the TE mode, similarly to the first embodiment.

The polarization switching characteristics are those as illustrated in FIG. 1. Further, in FIG. 7, when a constant bias current is injected through the electrode 712 into the waveguide region 721 with the three tensile-strained wells and a current injected through the electrode 713 into the waveguide region 722 with the two tensile-strained wells is increased, oscillation in the TM mode is started at the time of the current injection above the threshold, similarly to the first embodiment. When the injection current further increases, oscillation in the TE mode starts and simultaneously the TM-mode oscillation weakens and finally stops. Such operation principle is the same as that of the first embodiment. The driving method is also the same as that of the first embodiment.

Fourth Embodiment

Figure 9:
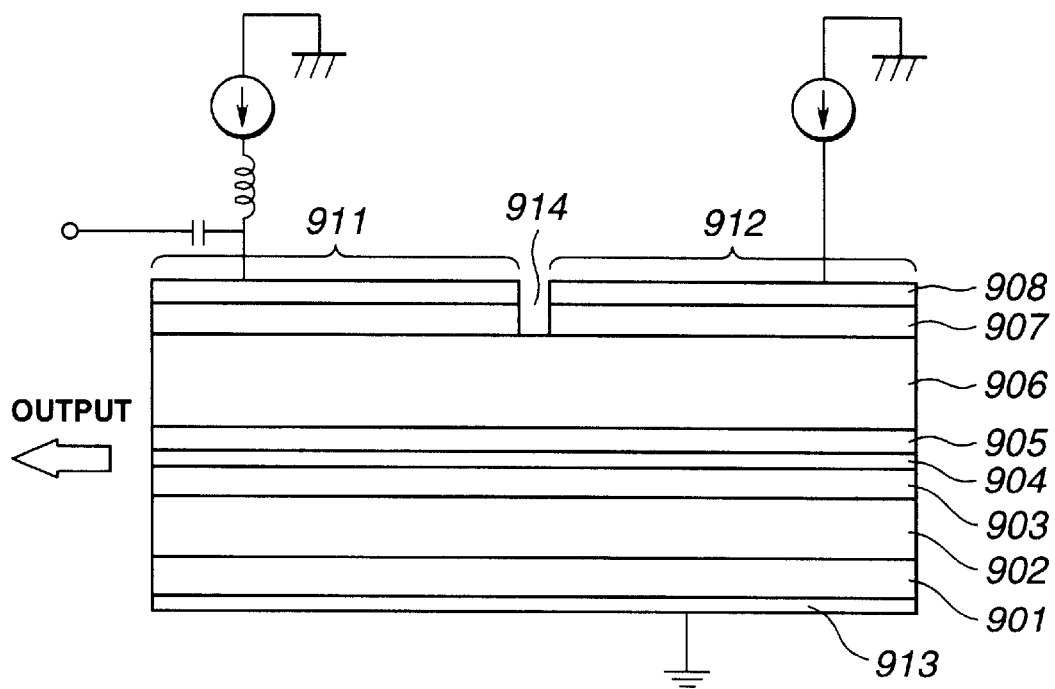
FIG. 9 is a cross-sectional view illustrating a polarization switchable semiconductor laser used in a fourth embodiment.

A fourth embodiment will be described with reference to FIG. 9. FIG. 9 schematically illustrates a polarization switchable Fabry-Perot semiconductor laser in a cross-sectional form, whose layer structure is the same as that of the third embodiment and which is used as a light source in the fourth embodiment.

As shown in FIG. 9, an n-InP buffer layer 902, a lower light guide layer 903 of InGaAsP, a quantum well active layer 904 with a MQW structure, an upper light guide layer 905 of InGaAsP, a p-InP clad layer 906, and a p-InGaAs contact layer 907 are formed on an n-InP substrate 901.

Further, p-side electrodes of Cr/Au layers 908, and an n-side electrode of an AuGe/Au layer 913 are formed. Reference numeral 914 designates an electrode-separation region formed by removing the p-side electrode 908 and the contact layer 907. A ridge waveguide for confinement of light and carriers in the lateral direction of the laser is further formed. Cleaved factes are formed on opposite end faces of the device.

The MQW active layer 904 will be described in more detail. In the MQW structure of the active layer 904, combined are a compressively-strained well structure having three well layers with a compressive strain of 0.5% for generating a gain for the TE mode, and a tensile-strained well structure having layers with a tensile strain of 0.9% for chiefly generating a gain for the TM mode but also generating a gain for the TE mode. Three tensile-strained well layers with the tensile strain of 0.9% are layered in a first waveguide 911, while two are layered in a second waveguide 912.

In the above structure, amounts of currents injected into the two waveguides 911 and 912 can be adjusted to establish a bias condition in which gains for the TE mode and the TM mode compete with each other with the first waveguide 911 being on the light emission side, similar to the third embodiment. Under such a bias condition, when the current injected into the first waveguide 911 for giving the gain for the TM mode is increased, a TM-mode oscillation state is reached. When the current decreases, TE-mode oscillation in turn occurs. That is, the intensity of the TM-mode light increases as the current injected through the electrode on the modulation side in this embodiment of the Fabry-Perot laser increases. In contrast, the intensity of the TE-mode light increased as the current injected through the electrode on the modulation side in the third embodiment of the DFB laser increased. The relation between the TE mode and the TM mode is thus reversed. In this case, when a modulation signal whose positive and negative portions are inverted compared to an original modulation signal is applied, or the TM-mode light selected by the polarization separation means as signal light is transmitted through the transmission line, this embodiment comes to be the same as the third embodiment. Although the oscillation is in a multi-mode but not in a single longitudinal mode in this embodiment, the polarization switching principle and operation of this embodiment are the same as those of the third embodiment.

Fifth Embodiment

A fifth embodiment will be described with reference to FIG. 10. In the fifth embodiment, light transmission is performed using a driving method of the present invention for driving a polarization switchable light source for optical communication.

Figure 10:
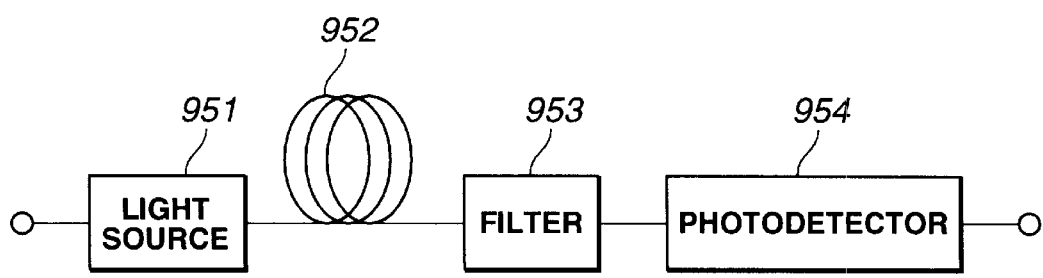
FIG. 10 is a view illustrating an optical transmission system of a fifth embodiment in which a method for driving a polarization switchable light source is used for optical communication in the present invention.

In FIG. 10, reference numeral 951 designates a light source for optical communication which performs an analog signal transmission under a condition in which its bias point is stabilized by the present invention. In such analog polarization modulation, since variation of carriers in the device is notably small, chirping is very small (in an ordinary direct intensity modulation, the carrier variation is large since an injection current is switched on and off). Therefore, when the analog signal in a band of, for example, about 1 GHz is transmitted, little crosstalk occurs even when channels are arranged at intervals of 10 GHz. As a result, where such a light source is used, the channel interval can be lowered and wavelength division multiplexing can be achieved with a high efficiency in use of wavelengths.

Modulated analog light emitted from the light source 951 is coupled to and transmitted through a single mode fiber 952. Light at a desired wavelength is selectively demultiplexed from the signal light transmitted through the optical fiber 952, by an optical filter 953 in a receiver. The analog signal is demodulated by a photodetector 954. A tunable fiber fabry-perot filter is used as the filter 953, for example.

Only one light source and one receiver are depicted in FIG. 10, but plural light sources or plural receivers connected by an optical coupler can be used.

Sixth Embodiment

The polarization switchable laser is modulated using an analog signal in the above embodiments, but the principle of the present invention can also be applied to a case where the polarization switchable laser is modulated using a digital signal. Sixth and seventh embodiments are directed to cases where the polarization switchable laser is modulated based on digital signals.

Figure 11:
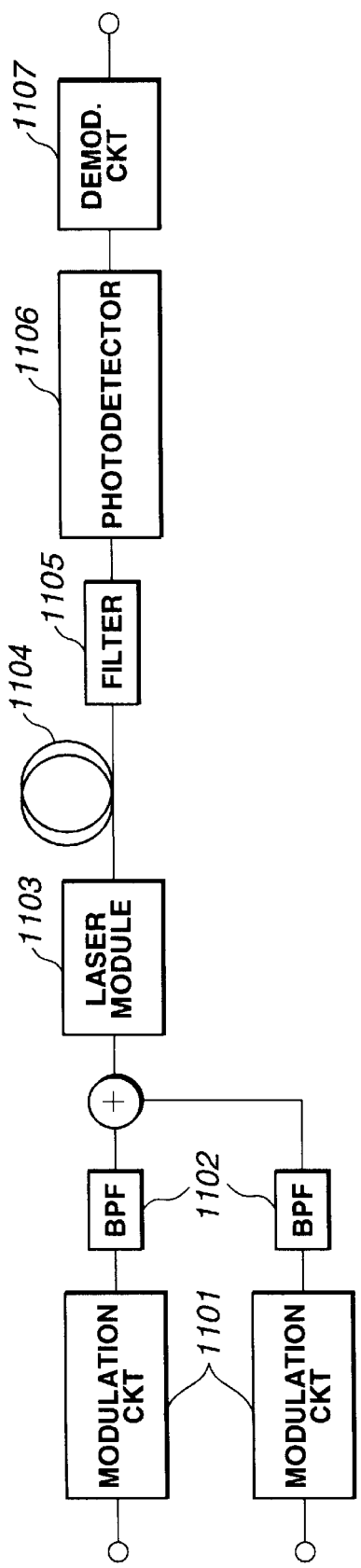
FIG. 11 is a view illustrating an optical transmission system of a sixth embodiment in which another method for driving a polarization switchable light source is used for optical communication in the present invention.

The sixth embodiment will be described with reference to FIG. 11, in which a driving method of a light source for optical communication according to the present invention is used to transmit a signal corresponding to an electric digital signal. Based on a digital baseband signal, a subcarrier (this is so named since light is a carrier) is analog-modulated by a modulation circuit 1101 of a system for, for example, quadruple phase shift keying (QPSK), 16-value quadrature amplitude modulation (16QAM), or the like. An analog modulation signal, whose band is limited, is then produced by a band pass filter 1102. Subcarrier division multiplexing may be performed to this modulation signal by using a subcarrier different therefrom and division-multiplexing another modulation signal thereto in a non-overlapping range. The modulation by using such multiplexed signals is preferable in the light of an efficiency in use of frequencies.

An analog polarization modulation laser module 1103 is driven by the thus-produced analog signal in the above-described manner. Light emitted from the laser module 1103 is coupled to and transmitted through a single mode fiber 1104. Light in only one mode (for example, TE-mode light) is selected by a polarization beam splitter and an isolator in the laser module 1103, similarly to the above embodiments. Light at a desired wavelength is selectively demultiplexed from the signal light transmitted through the optical fiber 1104, by an optical filter 1105 in a receiver. The analog signal is detected by a photodetector 1106, and the digital baseband signal is regenerated as an output of a demodulation circuit 1107. In the case of the subcarrier division multiplexed signals, there are provided plural demodulation circuits whose number corresponds to the number of multiplicity, and the analog signal obtained by the photodetector 1106 is distributed to those demodulation circuits.

Seventh Embodiment

Figure 12:
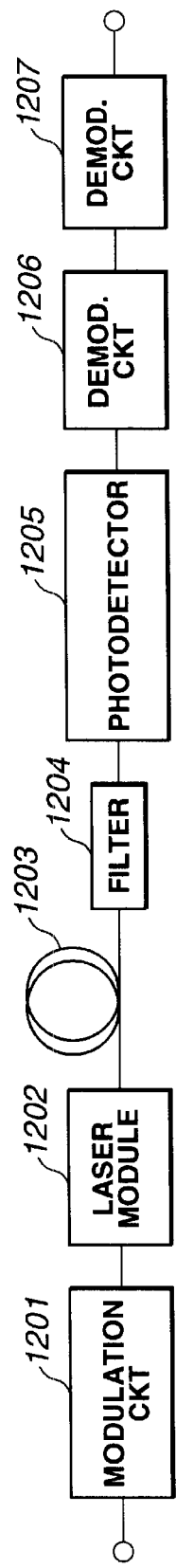
FIG. 12 is a view illustrating an optical transmission system of a seventh embodiment in which still another method for driving a polarization switchable light source is used for optical communication in the present invention.

A seventh embodiment will be described with reference to FIG. 12, in which a driving method of a light source for optical communication according to the present invention is used to transmit a signal corresponding to an electric digital signal.

A multi-value digital baseband signal is generated by a modulation circuit 1201. For example, a binary digital baseband signal is converted to a four-value or quaternary digital baseband signal by a modulation circuit 1201 of a 2-bit D/A converter (e.g., the binary digital signal is divided to sets of two bits, and each set is apportioned to one of four values). Alternatively, plural digital baseband signals are multiplexed to create a multi-value digital baseband signal (e.g., one bit is taken from each of two binary digital signals to create a set, and each set is apportioned to one of four values).

Though the thus-created signal has a plurality of voltage values, this signal is treated as an analog modulation signal for an analog polarization modulation laser module 1202. Thus, the polarization switchable laser is driven by such a modulation signal. Light emitted from the laser module 1202 is coupled to and transmitted through a single mode fiber 1203. Light at a desired wavelength is selectively demultiplexed from the signal light transmitted through the optical fiber 1203, by an optical filter 1204 in a receiver. The signal is detected by a photodetector 1205, and the multi-value digital baseband signal is regenerated by a demodulation circuit 1206. The original binary digital baseband signal is regenerated as an output of another demodulation circuit 1207 arranged downstream of the demodulation circuit 1206.

Eighth Embodiment

Figure 13:
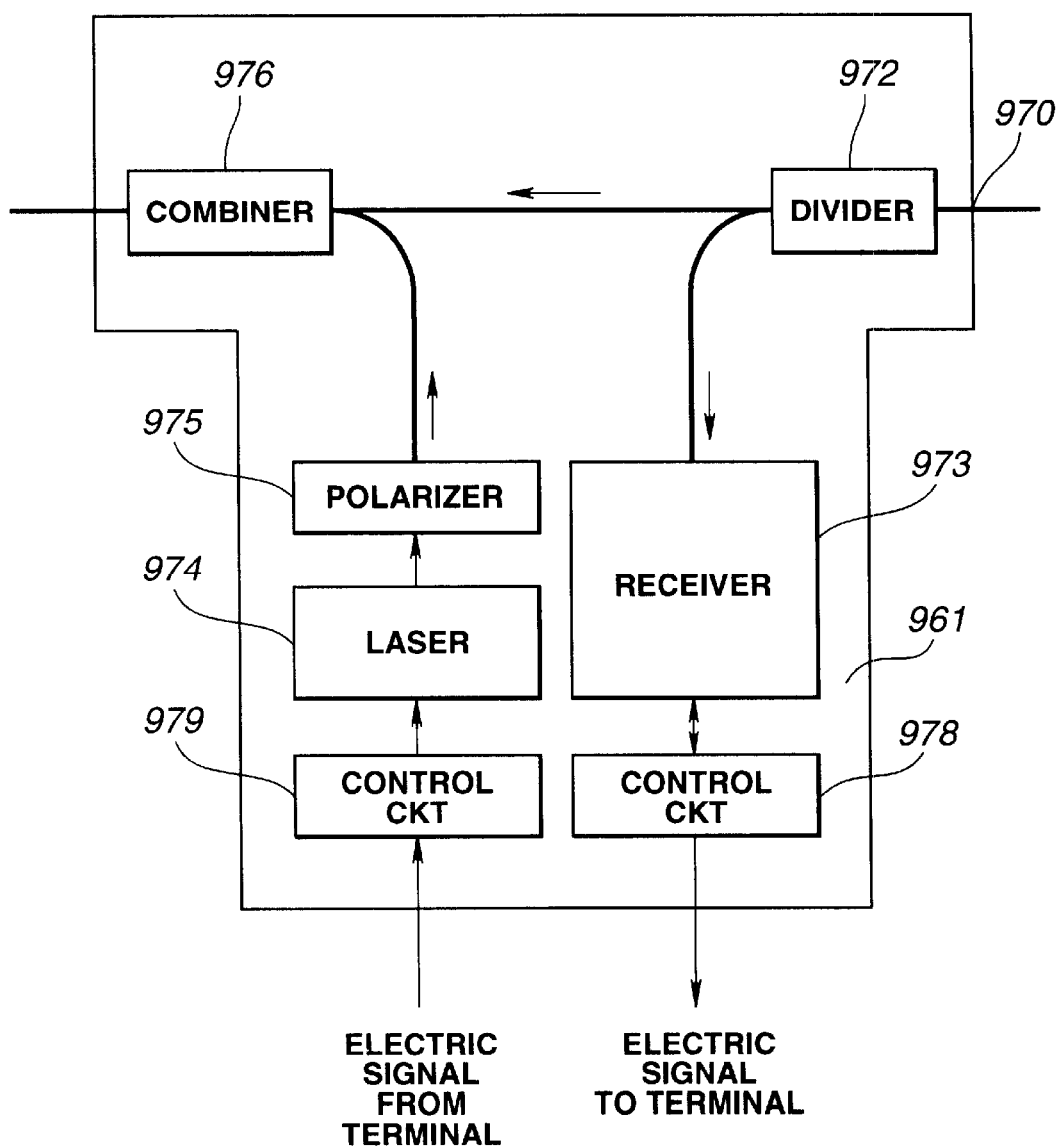
FIG. 13 is a block diagram illustrating the structure of a node including an opto-electric converting apparatus of an eighth embodiment of the present invention and used in a system of FIG. 14 or FIG. 15.

An eighth embodiment will now be described with reference to FIGS. 13, 14 and 15. The eighth embodiment is directed to an optical local area network (LAN) system or a wavelength division multiplexing optical LAN system using a light source including an oscillation polarization switchable laser of the present invention. FIG. 13 illustrates an opto-electric converting unit (node), 961, which is connected to a terminal of the optical LAN system shown in FIG. 14 or FIG. 15.

In FIG. 13, an optical signal is taken into the node 961 through an optical fiber 970, and a portion of a signal is input into an optical receiver 973 by an optical power divider 972. The optical receiver 973 is controlled by a control circuit 978, and includes a tunable optical filter and a photodetector to select only signal light at a desired wavelength from the incident signal light and detect the selected signal.

On the other hand, when an optical signal is transmitted from the node 961, signal light from an oscillation polarization switchable semiconductor laser 974 of the present invention is input into the optical fiber 970 by a power combiner 976 through a polarizer 975 and an isolator (not shown). The laser 974 is appropriately driven by a control circuit 979 based on an analog or digital signal according to the method described in the above embodiments, and a polarization-modulated light wave emitted from the laser 974 is converted to an intensity-modulated light output by the polarizer 975. The isolator may be omitted.

A plurality of tunable optical filters and semiconductor lasers may be arranged in a node to widen the wavelength tunable range. Where a laser of the fourth embodiment of FIG. 9 is used, one of the multiple longitudinal modes must be selected by a wavelength filter to be transmitted through the optical fiber 970.

Figure 14:
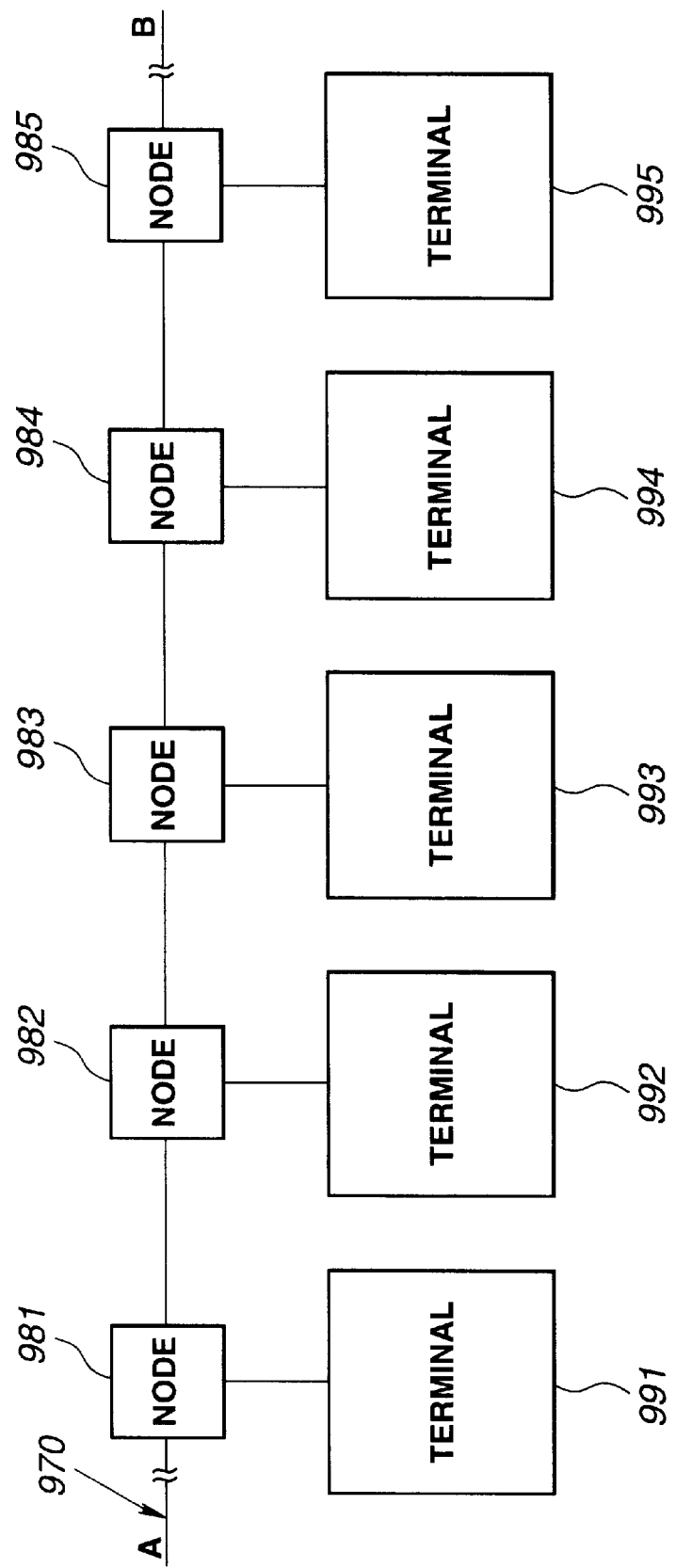
FIG. 14 is a block diagram illustrating a bus-type optical LAN system using a polarization switchable semiconductor laser of the present invention.
Figure 15:
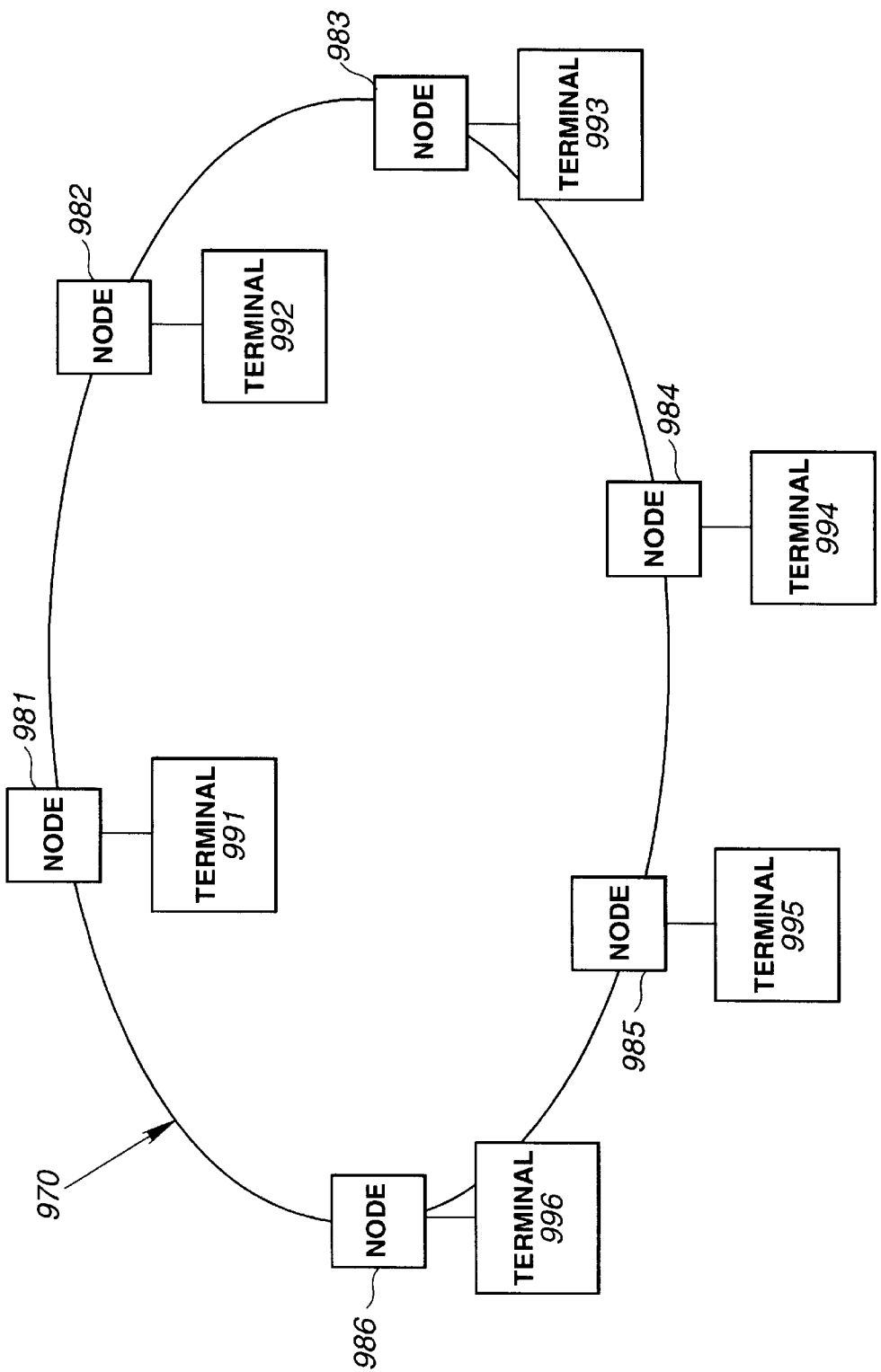
FIG. 15 is a block diagram illustrating a loop-type optical LAN system using a polarization switchable semiconductor laser of the present invention.

In a bus-type network shown in FIG. 14, multiple terminals or centers 991, 992, . . . , and 995 are connected to the optical fiber 970 respectively through optical nodes 981, 982, . . . , and 985 along a direction A–B. When a large number of nodes are connected, optical amplifiers need to be serially arranged on the transmission line 970 to compensate for attenuation of transmitted light.

Further, two nodes 981–985 may be connected to each terminal 991–995 and two optical fibers may be provided to accomplish bidirectional transmission of a DQDB system.

As a network, a loop type (see FIG. 15), which is constructed by connecting A and B in FIG. 14, a star type, or compound configuration thereof may be used.

As described in the foregoing, the following technical advantages can be obtained by the present invention:

When a polarization switchable semiconductor laser is driven according to an analog or digital signal, intensity-modulated light can be obtained with a large amplitude and little distortion. Thus, resistance of the signal to distortion can be increased during its transmission. Further, when a polarization switchable semiconductor laser with appropriate characteristics is used, an intensity modulation can be achieved with excellent linearity, leading to an intensity modulation with little distortion even for analog modulation. Furthermore, when light in such a polarization mode as is not used for transmission is used to monitor the, bias condition, a bias point of the current injected into the laser can be stabilized. Moreover, the bias condition can be controlled with high stability using a simple structure.

A polarization switchable laser preferably usable for such modulation can be provided. Further, there can be provided a light source apparatus which can separate intensity-modulated light to transmit it as an intensity-modulated signal, a communication system which can transmit an analog or digital signal, and a wavelength division optical transmission system which can readily perform transmission with a large capacity by using wavelength division multiplexing. An optical LAN system with an inexpensive cost and a high throughput can also be established.

Further, a transmission capacity can be increased by using a multi-value digital transmission system.

Except as otherwise disclosed herein, the various components shown in outline or block form in any of the FIGS. 1–15 are individually well known in the optical semiconductor device, driving method therefor and optical communication arts, and their internal construction and operation are not described herein.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A driving method for driving a semiconductor laser as a light source for optical transmission, said driving method comprising the steps of:

preparing a semiconductor laser provided with a structure in which oscillation light of the laser can be switched between two different polarization modes by modulating a current injected into a portion of a waveguide of the laser, and having characteristics that light in both of the two different polarization modes is emitted within a polarization-mode switching range of the current and the intensities of the light in both of the two different polarization modes respectively vary in accordance with an amount of the current within the polarization-mode switching range;

injecting the current into the portion of the waveguide to a bias point current in the polarization-mode switching range; and superimposing an analog-signal modulation on the bias point current such that the emitted light in at least one of the two different polarization modes is intensity-modulated in accordance with an amount of the modulation signal current, wherein the amplitude of the analog-signal modulation is less than the width of the polarization-mode switching range.

2. A driving method according to claim 1, an amount of a combination current of the modulation signal current and the bias point current being regulated within the polarization-mode switching range of the current.

3. A driving method according to claim 1, further comprising a step of modulating a digital signal to an analog-signal modulation current of the modulation signal current by modulation means.

4. A driving method according to claim 1, further comprising a step of modulating a digital signal to a multi-value digital-signal modulation current of the modulation signal current by modulation means.

5. A driving method according to claim 1, said preparing step preparing the semiconductor laser so that the laser has characteristics that light in both of the two different polarization modes is emitted within the polarization-mode switching range of the current and intensities of the light in both of the two different polarization modes respectively vary linearly in accordance with the amount of the modulation signal current within the polarization-mode switching range.

6. A driving method according to claim 1, said preparing step preparing the semiconductor laser to include a distributed feedback semiconductor laser wherein a waveguide and a diffraction grating formed near the waveguide are arranged, the waveguide including an active layer, the active layer being formed of a multiple quantum well structure into which a tensile strain is introduced, and one of a heavy-hole ground level in a quantum well of the multiple quantum well structure being nearly equal to a light-hole ground level in the quantum well of the multiple quantum well structure, and the light-hole ground level being closer than the the heavy-hole ground level to an electron ground level.

7. A driving method according to claim 1, said preparing step preparing semiconductor laser to include at least two electrodes in a cavity direction of the laser, and a plurality of waveguide portions which constitute the cavity, corresponding to those electrodes, such that currents can be independently injected into the plurality of waveguide portions.

8. A driving method according to claim 1, said preparing step preparing the semiconductor laser to include a structure having at least two electrodes arranged in a cavity direction of the laser, a plurality of waveguide portions which constitute the cavity, corresponding to the at least two electrodes such that currents can be independently injected into the plurality of waveguide portions, the plurality of waveguide portions including active layers with a plurality of quantum wells which respectively include at least one of a non-strained and a compressively-strained quantum well, and at least one tensile-strained quantum well, band gaps between ground levels in those quantum wells being set nearly equal to each other, and combinations of the quantum wells in the plurality of waveguide portions being different from each other.

9. A driving method according to claim 8, said preparing step preparing the semiconductor laser to include a distributed feedback semiconductor laser in which a waveguide with an active layer and a diffraction grating are formed near the waveguide.

10. A driving method according to claim 8, said preparing step preparing the semiconductor laser to include a Fabry-Perot semiconductor laser.

11. A driving method according to claim 1, further comprising the steps of:
separating the intensity-modulated light in the two different polarization modes emitted by the semiconductor laser from each other;
coupling the separated light in one of the two different polarization modes to a light transmission line;
converting the separated light in another of the two different polarization modes to an electric signal; and
controlling the current injected into the semiconductor laser based on the electric signal such that a modulation condition of the light coupled to the light transmission line in said coupling step can be stabilized.

12. A driving method according to claim 11, said controlling step comprising the steps of:
transmitting the electric signal through a low pass filter;
comparing a signal output from the low pass filter with a reference voltage by a differential amplifier to supply a resultant output; and
feeding back the resultant output to a DC current source for driving the semiconductor laser at an appropriate feedback rate using a proportional-plus-integral circuit.

13. A driving apparatus for driving a semiconductor laser as a light source for optical transmission, said driving apparatus comprising:
a semiconductor laser, oscillation light of said laser being switchable between two different polarization modes by modulating a current injected into a portion of a waveguide of said laser, and said laser having characteristics that light in both of the two different polarization modes is emitted within a polarization-mode switching range of the current and intensities of the light in both of the two different polarization modes respectively vary in accordance with an amount of the current within the polarization-mode switching range; and
current injecting means for injecting a current into the portion of the waveguide, the current being produced by superimposing an analog-signal modulation on a bias point current, which is placed in the polarization-mode switching range, such that the emitted light in at least one of the two different polarization modes is intensity-modulated in accordance with an amount of the modulation signal current, wherein the amplitude of the analog-signal modulation is less than the width of the polarization-mode switching range.

14. A driving apparatus according to claim 13, said current injecting means regulating an amount of a combination current of the modulation signal current and the bias point current within the polarization-mode switching range of the current.

15. A driving apparatus according to claim 13, further comprising modulation means for modulating a digital signal to an analog-signal modulation current of the modulation signal current.

16. A driving apparatus according to claim 13, further comprising modulation means for modulating a digital signal to a multi-value digital-signal modulation current of the modulation signal current.

17. A driving apparatus according to claim 13, said semiconductor laser having characteristics that light in both of the two different polarization modes is emitted within the polarization-mode switching range of the current and intensities of the light in both of the two different polarization modes respectively vary linearly in accordance with the amount of the modulation signal current within the polarization-mode switching range.

18. A driving apparatus according to claim 13, said semiconductor laser comprising a distributed feedback semiconductor laser wherein a waveguide and a diffraction grating formed near said waveguide are arranged, said waveguide including an active layer, said active layer being formed of a multiple quantum well structure into which a tensile strain is introduced, and one of a heavy-hole ground level in a quantum well of said multiple quantum well structure being nearly equal to a light-hole ground level in said quantum well of said multiple quantum well structure, and the light-hole ground level being closer than the heavy-hole ground level to an electron ground level.

19. A driving apparatus according to claim 13, said semiconductor laser including at least two electrodes in a cavity direction of said laser, and a plurality of waveguide portions which constitute the cavity, corresponding to said electrodes, such that currents can be independently injected into said plurality of waveguide portions.

20. A driving apparatus according to claim 13, said semiconductor laser comprising a structure having at least two electrodes arranged in a cavity direction of said laser, a plurality of waveguide portions which constitute the cavity, corresponding to said at least two electrodes such that currents can be independently injected into said plurality of waveguide portions, said plurality of waveguide portions including active layers with a plurality of quantum wells which respectively include at least one of a non-strained and a compressively-strained quantum well, and at least one tensile-strained quantum well, band gaps between ground levels in said quantum wells being set nearly equal to each other, and combinations of said quantum wells in said plurality of waveguide portions being different from each other.

21. A driving apparatus according to claim 20, said semiconductor laser comprising a distributed feedback semiconductor laser in which a waveguide with an active layer and a diffraction grating are formed near said waveguide.

22. A driving apparatus according to claim 20, said semiconductor laser comprising a Fabry-Perot semiconductor laser.

23. A driving apparatus according to claim 13, further comprising:

means for separating the intensity-modulated light in the two different polarization modes emitted by said semiconductor laser from each other;

means for coupling the separated light in one of the two different polarization modes to a light transmission line;

means for converting the separated light in another of the two different polarization modes to an electric signal; and means for controlling the current injected into said semiconductor laser based on the electric signal such that a modulation condition of the light coupled to the light transmission line can be stabilized.

24. A driving apparatus according to claim 23, said controlling means comprising:

a low pass filter for transmitting the electric signal therethrough;

a differential amplifier for comparing a signal output from said low pass filter with a reference voltage to supply a resultant output; and a proportional-plus-integral circuit for feeding back the resultant output to a DC current source for driving said semiconductor laser at an appropriate feedback rate.

25. A light source apparatus comprising:

a driving apparatus for driving a semiconductor laser as a light source for optical transmission, said driving apparatus including:

a semiconductor laser, oscillation light of said laser being switchable between two different polarization modes by modulating a current injected into a portion of a waveguide of said laser, and said laser having characteristics that light in both of the two different polarization modes is emitted within a polarization-mode switching range of the current and intensities of the light in both of the two different polarization modes respectively vary in accordance with an amount of the current within the polarization-mode switching range; and current injecting means for injecting a current into the portion of the waveguide, the current being produced by superimposing an analog-signal modulation on a bias point current, which is placed in the polarization-mode switching range, such that the emitted light in at least one of the two different polarization modes is intensity-modulated in accordance with an amount of the modulation signal current, wherein the amplitude of the analog-signal modulation is less than the width of the polarization-mode switching range; and polarization-mode selecting means for selecting light in one of the two different polarization modes from light emitted from said semiconductor laser.

* * * * *

UNITED STATES PATENT AND TRADEMARK OFFICE
CERTIFICATE OF CORRECTION

PATENT NO. : 6,526,075 B2
DATED : February 25, 2003
INVENTOR(S) : Natsuhiko Mizutani It is certified that error appears in the above-identified patent and that said Letters Patent is hereby corrected as shown below:

Column 4,
Line 29, "includes" should read -- include --.

Column 6,
Line 14, "Lode" should read -- mode --.

Column 13,
Line 57, "the," should read -- the --.

Column 15,
Line 9, "the the" should read -- the --.

Signed and Sealed this

Eighteenth Day of November, 2003

JAMES E. ROGAN
*Director of the United States Patent and Trademark Office*